US010082349B2

(12) United States Patent
Wang et al.

(10) Patent No.: US 10,082,349 B2
(45) Date of Patent: Sep. 25, 2018

(54) HEAT CONDUCTING MODULE

(71) Applicant: NATIONAL CHIAO TUNG UNIVERSITY, Hsinchu (TW)

(72) Inventors: Chi-Chuan Wang, Hsinchu County (TW); Kuo-Wei Lin, New Taipei (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 81 days.

(21) Appl. No.: 14/988,764

(22) Filed: Jan. 6, 2016

(65) Prior Publication Data
US 2017/0064866 A1    Mar. 2, 2017

(30) Foreign Application Priority Data

Aug. 28, 2015    (TW) .............................. 104128468 A

(51) Int. Cl.
*F28F 13/18*    (2006.01)
*H05K 7/20*    (2006.01)
*H01L 23/473*    (2006.01)

(52) U.S. Cl.
CPC .......... *F28F 13/187* (2013.01); *H01L 23/473* (2013.01); *H05K 7/20218* (2013.01); *H05K 7/20254* (2013.01); *F28F 2260/02* (2013.01)

(58) Field of Classification Search
CPC ........ F28F 13/187; F28F 13/18; F28F 13/185; F28F 13/182; F28F 99/00; F28F 2260/02;
(Continued)

(56) References Cited

U.S. PATENT DOCUMENTS 5,259,448 A * 11/1993 Masukawa ............ B21C 37/202
                                                    165/133
6,351,384 B1 * 2/2002 Daikoku .................. F28F 3/02
                                                    165/80.3
(Continued)

FOREIGN PATENT DOCUMENTS

JP    2013-256967 A    12/2013
TW    I303553 B        11/2008
TW    I415558 B        11/2013

OTHER PUBLICATIONS

Chienliu Chang et al., "Etching submicrometer trenches by using the Bosch process and its application to the fabrication of antireflection structures", Journal of Micromechanics and Microengineering, vol. 15, No. 3, p. 580-585, Jan. 13, 2005.
(Continued)

*Primary Examiner* — Hung Q Nguyen
*Assistant Examiner* — Mark L Greene
(74) *Attorney, Agent, or Firm* — CKC & Partners Co., Ltd.

(57) ABSTRACT

A heat conducting module includes a main body. The main body includes a first surface and a second surface. The first surface is thermally connected to a heat absorbing body. The second surface is opposite to the first surface and is fluidly connected to a channel. The second surface has a plurality of grooves disposed along a direction. The channel allows a fluid to flow a long the direction. Each of the grooves includes a first sub-groove and at least one second sub-groove. The first sub-groove at least has a third surface close to the first surface. The first sub-groove at least partially communicates with the second sub-groove, and the second sub-groove is at least partially fluidly connected with the third surface.

7 Claims, 2 Drawing Sheets

(58) Field of Classification Search
CPC .. F28F 2215/10; F28F 2260/00; H01L 23/473
See application file for complete search history.

(56) References Cited

U.S. PATENT DOCUMENTS

| | | | | |
|---|---|---|---|---|
| 6,983,792 | B2 | 1/2006 | Dickey et al. | |
| 7,000,427 | B2* | 2/2006 | Mathias | F25J 1/0022 62/612 |
| 7,104,312 | B2* | 9/2006 | Goodson | F04B 19/006 165/104.33 |
| 7,435,623 | B2* | 10/2008 | Chrysler | H01L 23/473 257/E21.499 |
| 8,061,032 | B2* | 11/2011 | Banham | C25D 1/02 204/450 |
| 8,353,334 | B2* | 1/2013 | Zhao | F28D 15/046 165/104.26 |
| 8,505,497 | B2* | 8/2013 | Lundgreen | F28F 13/187 122/15.1 |
| 2002/0146540 | A1* | 10/2002 | Johnston | E04F 15/02161 428/167 |
| 2004/0069459 | A1* | 4/2004 | Tonosaki | F28D 15/0266 165/104.25 |
| 2009/0250196 | A1* | 10/2009 | Batty | B22F 3/1055 165/104.26 |
| 2014/0238646 | A1* | 8/2014 | Enright | F28F 13/187 165/104.21 |

OTHER PUBLICATIONS

"Enhanced Condensation Heat Transfer for Dielectric Fluid within Micro-Channel Heat Sink" presented by Kuo-Wei Lin on 2015 Taiwan Thermal Management Association Annual Meeting and Presentation of Technical Achievements.

Shin, J. S. et al., "An Experimental Study of Condensation Heat Transfer Inside a Mini-Channel with a New Measurement Technique", International Journal of Multiphase Flow, pp. 311-325, 2004.

Kuo, C.V. et al., "Two-Phase Flow Pressure Drop and Heat Transfer during Condensation in Microchannels with Uniform and Converging Cross-Sections", Journal of Micromechanics and Microengineering, 13 pages, 2010.

Mghari, H. E. et al., "Condensation Heat Transfer Enhancement in a Horizontal Non-Circular Microchannel", Applied Thermal Engineering, pp. 358-370, 2014.

Wang Hui et al., "Recent Advances of the Phase Change Microchannel Cooling Structure", Journal of Mechanical Engineering., vol. 46, No. 24, pp. 101-106, Dec. 2010.

Chen Yongping et al., "Review of condensation in microchannels", Journal of Chemical industry and Engineering (China)., vol. 58, No. 9, pp. 2153-2160, Sep. 2007.

Chen Deng-Ke, "New Technologies of Electronics Cooling", Chinese Journal of Low Temperature Physics, vol. 27, No. 3, pp. 255-262, Aug. 2005.

Lu Yong-chao et al., "A Review of Thermal Analysis, Thermal Design and Thermal Test Technology and Their Recent Development", Electro-Mechanical Engineering, vol. 23, No. 1, pp. 5-10, 2007.

Carey, V.P., "Liquid-Vapor Phase Change Phenomena", Taylor & Francis Series in Mechanical Engineering, pp. 411-414, New York, 1992.

Collier, J. G., et al.,"Convective Boiling and Condensation", Oxford Science Publications., 3rd Edition, p. 35, 38, 1994.

Zivi, S. M., "Estimation of Steady-State Steam Void-Fraction by Means of the Principle of Minimum Entropy roduction", ASME Journal of Heat Transfer, pp. 247-252, 1964.

* cited by examiner

HEAT CONDUCTING MODULE

RELATED APPLICATIONS

This application claims priority to Taiwanese Application Serial Number 104128468, filed Aug. 28, 2015, which is herein incorporated by reference.

BACKGROUND

Technical Field

The present disclosure relates to a heat conducting module. More particularly, the present disclosure relates to a heat conducting module with sub-grooves.

Description of Related Art

With advancements in technology, the market has been flooded with a variety of electronic products. Moreover, in order to satisfy consumer demand related to increasingly higher requirements, in addition to becoming smaller in size, many electronic products are becoming more and more efficient.

However, during the operation of electronic products with a high efficiency, the electronic elements inside the electronic products are prone to produce a large amount of heat. Such a large amount of heat can easily cause a reduction in the operating efficiency of the electronic products, and may even lead to damage of the electronic products due to overheating. As a result ways in which to remove heat from a small area in order to maintain the operating efficiency of the electronic products and to extend the working life of the electronic products are undoubtedly an important area of research and development in the industry.

SUMMARY

A technical aspect of the present disclosure provides a heat conducting module which can effectively reduce the membrane thickness of a liquid membrane in a first sub-groove, so as to correspondingly increase the conducting efficiency of a heat conducting module.

According to an embodiment of the present disclosure, a heat conducting module includes a main body. The main body includes a first surface and a second surface. The first surface is thermally connected to a heat absorbing body. The second surface is opposite to the first surface and is fluidly connected to a channel. The second surface has a plurality of grooves disposed along a direction. The channel allows a fluid to flow along the direction. Each of the grooves includes a first sub-groove and at least one second sub-groove. The first sub-groove at least has a third surface close to the first surface. The first sub-groove at least partially communicates with the second sub-groove, and the second sub-groove is at least partially fluidly connected with the third surface.

According to an embodiment of the present disclosure, the main body includes a heat conducting material.

According to an embodiment of the present disclosure, a hydraulic diameter of the second sub-groove is smaller than a hydraulic diameter of the first sub-groove.

According to an embodiment of the present disclosure, the second sub-groove has at least one fourth surface and a side surface. The fourth surface is close to the first surface. The side surface is distanced from the first sub-groove. The side surface and the fourth surface form an angle therebetween.

According to an embodiment of the present disclosure, the angle is substantially a right angle.

According to an embodiment of the present disclosure, a first width of the fourth surface is in a range from 10 μm to 1000 μm.

According to an embodiment of the present disclosure, second width of the third surface is in a range from 10 μm to 1000 μm.

According to an embodiment of the present disclosure, the first sub-groove has a first length. The second sub-groove has a second length. The ratio of the second length to the first length is in a range from 20% to 80%.

When compared with the prior art, the above-mentioned embodiments of the present disclosure have at least the following advantages:

(1) Since the second sub-groove can produce a larger surface tension than the first sub-groove, the liquid membrane in the first sub-groove can be at least partially drawn into the second sub-groove. Consequently, the membrane thickness of the liquid membrane in the first sub-groove can be effectively reduced, and the heat of the other parts of the fluid flowing in the first sub-groove can be more easily conducted to the third surface. As a result the conducting efficiency of the heat conducting module can be correspondingly increased.

(2) Since the side surface and the fourth surface of the second sub-groove form an angle therebetween, the liquid membrane in the first groove is more likely to be drawn into the second sub-groove. This can further facilitate a reduction in the membrane thickness of the liquid membrane in the first sub-groove.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
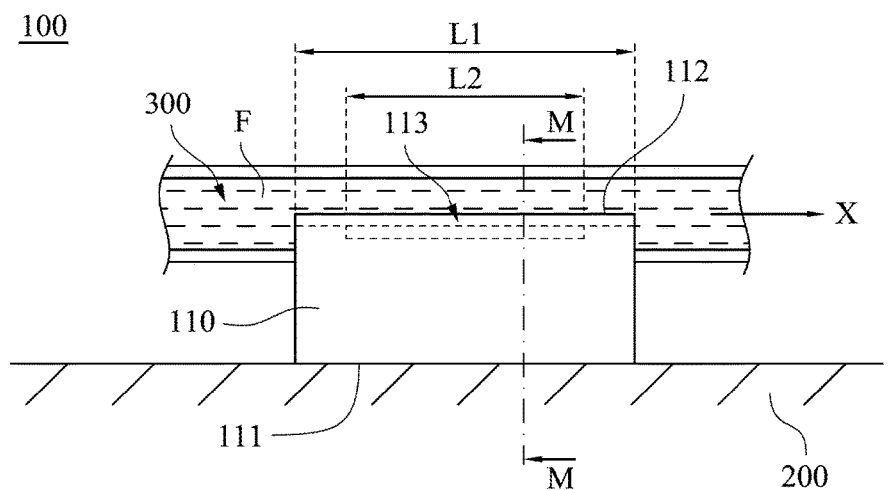
FIG. 1 is a schematic diagram of the application of a heat conducting module according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
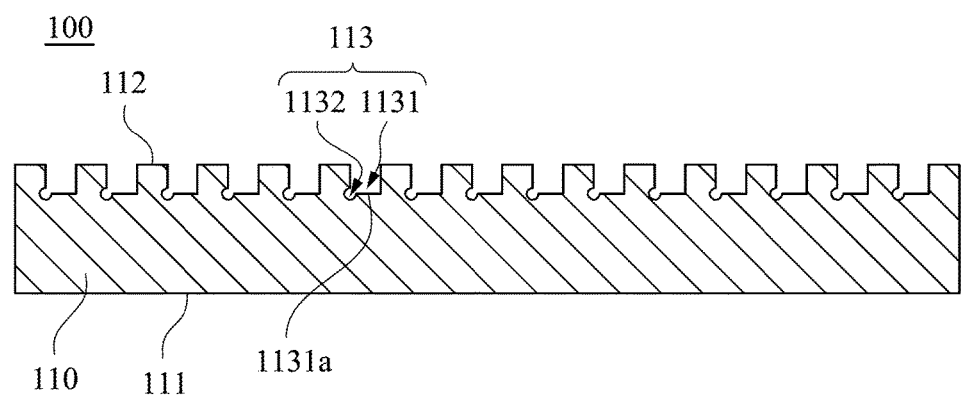
FIG. 2 is a sectional view of the heat conducting module of FIG. 1 taken along line M-M.

Reference is made first to FIGS. 1 and 2. FIG. 1 is a schematic diagram of the application of a heat conducting module 100 according to an embodiment of the present disclosure. FIG. 2 is a sectional view of the heat conducting module 100 of FIG. 1 taken along line M-M. As shown in FIGS. 1 and 2, the heat conducting module 100 includes a main body 110. The main body 110 includes a first surface 111 and a second surface 112. The first surface 111 is thermally connected to a heat absorbing body 200. The second surface 112 is opposite to the first surface 111 and is fluidly connected to a channel 300. The second surface 112 has a plurality of grooves 113 disposed along a direction X. The channel 300 allows a fluid F to flow along the direction X. Each of the grooves 113 includes a first sub-groove 1131 and at least one second sub-groove 1132. The first su b-groove 1131 at least has a third surface 1131a close to the first surface 111. The first sub-groove 1131 at least partially communicates with the second sub-groove 1132, and the second sub-groove 1132 is at least partially fluidly connected with the third surface 1131a.

In practical applications, the fluid F carrying heat flows through the channel 300 along the direction X. A part of the heat of the fluid F conducts to the second surface 112 of the main body 110 through the mechanism of heat conduction. The part of the heat conducted to the second surface 112 is conducted to the first surface 111 through the main body 110, and is then conducted to the heat absorbing body 200. In order to achieve a better conduction effect of the main body 110, the main body 110 includes a heat conducting material, i.e., a material with a high coefficient of heat conduction, such as copper, aluminum, silicon, etc. However, this choice of heat conducting material is not intended to limit the present disclosure.

As mentioned above, the second surface 112 has a plurality of grooves 113 disposed along the direction X. Therefore, when the fluid F carrying the heat flows through the channel 300 in the direction X, a part of the fluid F carrying the heat will flow in the grooves 113 along the direction X. In this way, the area of the contact surface between the main body 110 and the fluid F is increased, such that a part of the heat of the fluid F can be conducted to the main body 110 through the mechanism of heat conduction in a more efficient way. In this embodiment, the number of the grooves 113 is fifteen. However, this number of the grooves 113 is not intended to limit the present disclosure.

In addition and in greater detail, the first sub-groove 1131 of each of the grooves 113 at least has the third surface 1131a. Therefore, a part of the heat of the fluid F flowing in the grooves 113 along the direction X conducts to the third surface 1131a of the main body 110 through the mechanism of heat conduction. The part of the heat conducted to the third surface 1131a is conducted to the first surface 111 through the main body 110, and is then conducted to the heat absorbing body 200. Since the third surface 1131a is closer to the first surface 111 than the second surface 112 to the first surface 111, the part of the heat conducted to the third surface 1131a can be conducted to the first surface 111 through the mechanism of heat conduction in a more efficient way. In this embodiment, a first width W1 of the third surface 1131a is in a range from 10 μm to 1000 μm. However, this range of the first width W1 is not intended to limit the present disclosure.

In practical applications, since the flow of the fluid F in the grooves 113 along the direction X is affected by the friction of the third surfaces 1131a, a liquid membrane LM is easily formed on each of the third surfaces 1131a. Moreover, due to the friction of the third surfaces 1131a, the flowing speed of the liquid membrane LM is slower than other parts of the fluid F flowing in the grooves 113. Furthermore, since the liquid membrane LM provides isolation between the fluid F flowing in the grooves 113 and the third surface 1131a, the heat of the other parts of the fluid F flowing in the grooves 113 has to pass through the liquid membrane LM in order to be conducted to the third surface 1131a.

As mentioned above and as shown in FIGS. 1 and 2, the first sub-groove 1131 at least partially communicates with the second sub-groove 1132, and the second sub-groove 1132 is at least partially fluidly connected with the third surface 1131a. In addition, a hydraulic diameter of the second sub-groove 1132 is smaller than a hydraulic diameter of the first sub-groove 1131. Theoretically, a hydraulic diameter is a diameter transformed from a non-circular pipe equivalently to a circular pipe. A smaller hydraulic diameter generates a larger surface tension to the fluid flowing therein. In other words, the second sub-groove 1132 can produce a larger surface tension than the first sub-groove 1131. Hence, the liquid membrane LM in the first sub-groove 1131 as mentioned above can be at least partially drawn into the second sub-groove 1132. Consequently, a membrane thickness TK of the liquid membrane LM in the first sub-groove 1131 can be effectively reduced, and the heat of the other parts of the fluid F flowing in the first sub-groove 1131 can be more easily conducted to the third surface 1131a. As a result, the conducting efficiency of the heat conducting module 100 can be correspondingly increased.

Figure 3:
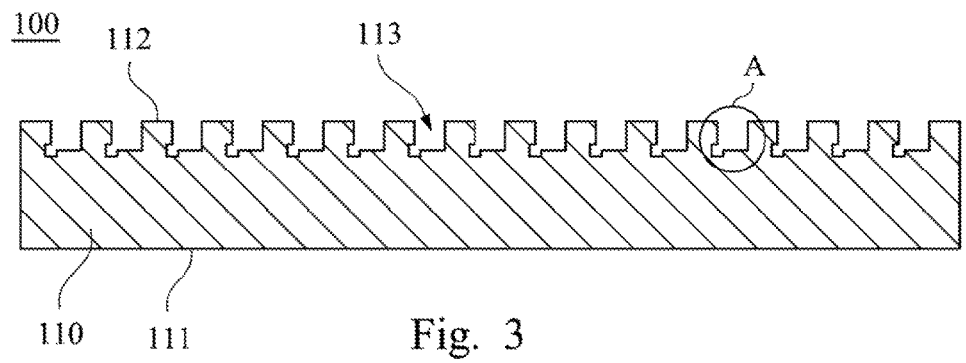
FIG. 3 is a sectional view of a heat conducting module according to another embodiment of the present disclosure.
Figure 3A:
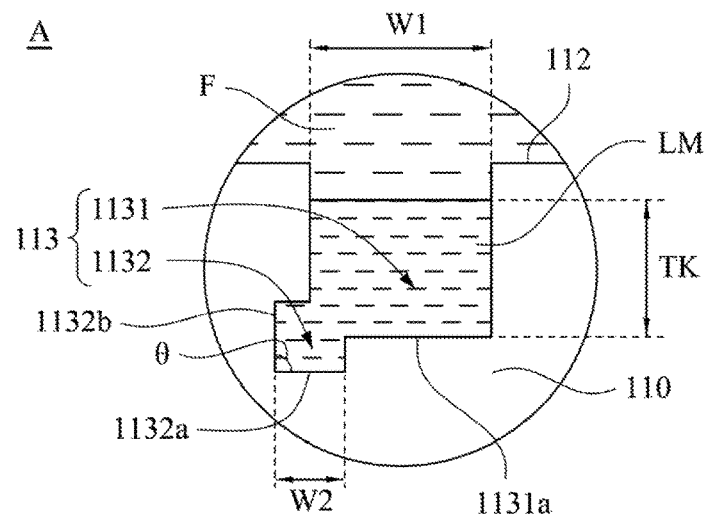
FIG. 3A is an enlarged view of part A of FIG. 3.

Reference is made now to FIGS. 3 and 3A. FIG. 3 is a sectional view of a heat conducting module 100 according to another embodiment of the present disclosure. FIG. 3A is an enlarged view of part A of FIG. 3. As shown in FIGS. 3 and 3A, the second sub-groove 1132 has at least one fourth surface 1132a and a side surface 1132b. The fourth surface 1132a is close to the first surface 111. The side surface 1132b is distanced from the first sub-groove 1131. The side surface 1132b and the fourth surface 1132a form an angle θ therebetween. Theoretically, the angle θ can further increase the surface tension produced to the fluid F. As a result, the liquid membrane LM in the first groove 1131 is more likely to be drawn into the second sub-groove 1132. This can further facilitate a reduction in the membrane thickness TK of the liquid membrane LM in the first sub-groove 1131. In this embodiment, the angle θ is substantially a right angle, i.e., 90°. A first second width W2 of the fourth surface 1132a is in a range from 10 μm to 1000 μm. However, this range of the second width W2 is not intended to limit the present disclosure.

Structurally speaking, the first sub-groove 1131 has a first length L1. The second sub-groove 1132 has a second length L2. The ratio of the second length L2 to the first length L1 is in a range from 20% to 80%. For example, the first length L1 can be 2.6 cm, and the second length L2 can be 1.25 cm, such that the ratio of the second length L2 to the first length L1 is about 48%.

Figure 4:
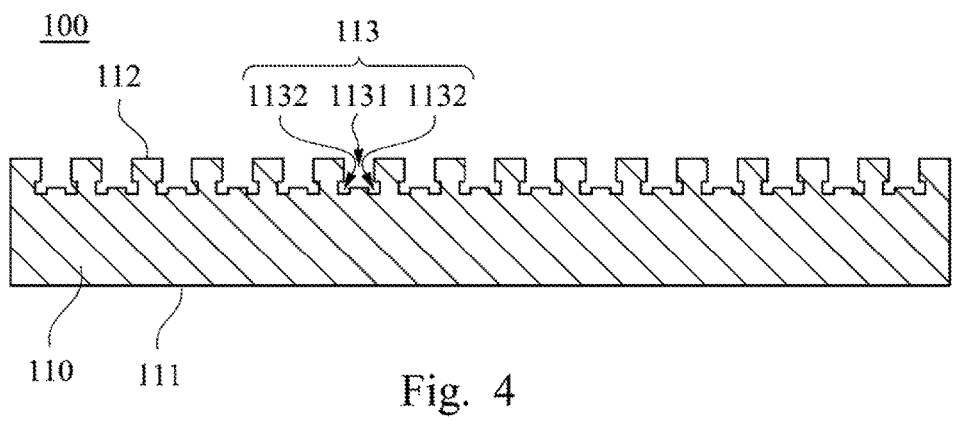
FIG. 4 is a sectional view of a heat conducting module according to a further embodiment of the present disclosure.

Reference is made next to FIG. 4. FIG. 4 is a sectional view of a heat conducting module 100 according to a further embodiment of the present disclosure. As shown in FIG. 4, the number of the second sub-groove 1132 is two. The two second sub-grooves 1132 are respectively disposed at two opposite sides of the first sub-groove 1131, further facilitating the drawing of the liquid membrane LM formed in the first sub-groove 1131 into the second sub-grooves 1132. This can further facilitate a reduction in the membrane thickness TK of the liquid membrane LM in the first sub-groove 1131, and moreover, the heat of the other parts of the fluid F flowing in the first sub-groove 1131 can be more easily conducted to the third surface 1131a. As a result, the conducting efficiency of the heat conducting module 100 can be correspondingly increased.

In conclusion, when compared with the prior art, the embodiments of the present disclosure mentioned above have at least the following advantages;

(1) Since the second sub-groove can produce a larger surface tension than the first sub-groove, the liquid membrane in the first sub-groove can be at least partially drawn into the second sub-groove. Consequently, the membrane thickness of the liquid membrane in the first sub-groove can be effectively reduced, and the heat of the other parts of the fluid flowing in the first sub-groove can be more easily conducted to the third surface. As a result, the conducting efficiency of the heat conducting module can be correspondingly increased.

(2) Since the side surface and the fourth surface of the second sub-groove form an angle therebetween, the liquid membrane in the first groove is more likely to be drawn into the second sub-groove. This can further facilitate a reduction in the membrane thickness of the liquid membrane in the first sub-groove.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A heat conducting module, comprising:
a main body, comprising:
a first surface thermally connected to a heat absorbing body; and
a second surface opposite to the first surface and in a channel, the second surface having a plurality of grooves disposed along a lengthwise direction, the channel allowing a fluid to flow along the lengthwise direction, each of the plurality of grooves comprising:
a first sub-groove; and
at least one second sub-groove extending into a sidewall and a floor of the first sub-groove;
wherein the main body having two opposite end portions to define two opposite flow-stop ends of the at least one second sub-groove along the lengthwise direction; and
wherein the first sub-groove has a first length in the lengthwise direction of the channel, the at least one second sub-groove has a second length in the lengthwise direction of the channel, and a ratio of the second length to the first length is in a range from 20% to 80%.

2. The heat conducting module of claim 1, wherein the main body comprises a heat conducting material.

3. The heat conducting module of claim 1, wherein a hydraulic diameter of the at least one second sub-groove is smaller than a hydraulic diameter of the first sub-groove.

4. The heat conducting module of claim 1, wherein the at least one second sub-groove has at least one fourth surface and a side surface, the fourth surface is closer to the first surface than the side surface is to the first surface, the side surface is distanced from the first sub-groove, and the side surface and the fourth surface form an angle therebetween.

5. The heat conducting module of claim 4, wherein the angle is a right angle.

6. The heat conducting module of claim 4, wherein a first width of the fourth surface is in a range from 10 µm to 1000 µm.

7. The heat conducting module of claim 1, wherein the first sub-groove has a third surface closer to the first surface than the second surface is to the first surface, and a second width of the third surface is in a range from 10 µm to 1000 µm.

* * * * *